US009778322B2

United States Patent
Gu et al.

(10) Patent No.: US 9,778,322 B2
(45) Date of Patent: Oct. 3, 2017

(54) LIGHTING JIG

(71) Applicants: BOE Technology Group Co., Ltd., Beijing (CN); BOE Optical Science and Technology Co., Ltd., Suzhou (CN)

(72) Inventors: Zhenghe Gu, Beijing (CN); Xingxing Li, Beijing (CN); Yuqi Mei, Beijing (CN)

(73) Assignees: BOE TECHNOLOGY GROUP CO., LTD., Beijing (CN); BOE OPTICAL SCIENCE AND TECHNOLOGY CO., LTD., Suzhou (CN)

( * ) Notice: Subject to any disclaimer, the term of this patent is extended or adjusted under 35 U.S.C. 154(b) by 803 days.

(21) Appl. No.: 14/087,733

(22) Filed: Nov. 22, 2013

(65) Prior Publication Data
US 2014/0167770 A1 Jun. 19, 2014

(30) Foreign Application Priority Data
Dec. 14, 2012 (CN) .......................... 2012 1 0544710

(51) Int. Cl.
*G01R 31/44* (2006.01)
*G09G 3/00* (2006.01)
(Continued)

(52) U.S. Cl.
CPC ............. *G01R 31/44* (2013.01); *G09G 3/006* (2013.01); *G09G 3/3406* (2013.01);
(Continued)

(58) Field of Classification Search
CPC ............................ G01R 31/44; G01R 31/2635
See application file for complete search history.

(56) References Cited

U.S. PATENT DOCUMENTS 3,733,704 A * 5/1973 Farabaugh ............. G01B 7/287
33/1 BB
5,488,258 A * 1/1996 Honda ................... H03F 1/305
307/112
(Continued)

FOREIGN PATENT DOCUMENTS

CN 2446625 Y 9/2001
CN 2745164 Y 12/2005
(Continued)

OTHER PUBLICATIONS

Notification of the Second Office Action and examination report fom the Chinese Patent Office for priority application 201210544710.1 dated Jan. 21, 2015 with English translation.
(Continued)

*Primary Examiner* — Clayton E Laballe
*Assistant Examiner* — Noam Reisner
(74) *Attorney, Agent, or Firm* — Haug Partners LLP

(57) ABSTRACT

The present invention discloses a lighting jig for testing a backlight module, comprising a switch unit and a delay unit; wherein the switch unit is connected to a power supply, and when the switch unit is in closed position, a power output terminal of the lighting jig is electrically connected to a power input terminal of the backlight module, a closing signal is generated at the same time, and the closing signal is output to the delay unit; and the delay unit is connected to the power supply, and outputs a delayed power signal to the power input terminal of the backlight module upon receipt of the closing signal output from the switch unit so as to delay the lighting up of the backlight module.

21 Claims, 2 Drawing Sheets

(51) Int. Cl.
*G09G 3/34* (2006.01)
*G02F 1/1335* (2006.01)
*G02F 1/13* (2006.01)

(52) U.S. Cl.
CPC .......... *G02F 1/1309* (2013.01); *G02F 1/1336* (2013.01); *G09G 2330/025* (2013.01); *G09G 2330/04* (2013.01)

(56) References Cited

U.S. PATENT DOCUMENTS

| | | | |
|---|---|---|---|
| 7,109,833 B1* | 9/2006 | Pohl | H01H 47/18 335/59 |
| 2003/0127465 A1* | 7/2003 | MacLean | B05B 12/00 222/146.5 |
| 2005/0195388 A1 | 9/2005 | Huang et al. | |
| 2007/0171618 A1* | 7/2007 | Kim | G09G 3/006 361/730 |
| 2007/0182842 A1* | 8/2007 | Sonnenschein | A61B 1/00124 348/340 |
| 2007/0188425 A1 | 8/2007 | Saccomanno | |
| 2008/0048494 A1* | 2/2008 | Hsieh | H02J 1/14 307/10.6 |
| 2009/0179424 A1* | 7/2009 | Yaron | B60K 6/24 290/52 |
| 2010/0053040 A1* | 3/2010 | Nishi | G09G 3/20 345/76 |

FOREIGN PATENT DOCUMENTS

| | | |
|---|---|---|
| CN | 201637564 U | 11/2010 |
| CN | 202133533 U | 2/2012 |
| CN | 102591046 A | 7/2012 |
| CN | 102621917 A | 8/2012 |
| JP | 08-43252 A | 2/1996 |
| KR | 10-1078296 B | 11/2011 |
| TW | 201137342 A | 11/2011 |

OTHER PUBLICATIONS

"Time Delay Relays—Application Data", retrieved from internet http://www.serelays.com/library/section5/105A, dated Jan. 26, 2011.

Notification of the First Office Action and examination report from the Chinese Patent Office for priority application 201210544710.1 dated Sep. 2, 2014 with English translation.

Extended European Search Report from European Patent Office for corresponding European application 13193091.9 dated Feb. 24, 2014.

* cited by examiner

LIGHTING JIG

FIELD OF THE INVENTION

The present invention relates to the field of backlight module lighting test technology and in particularly, to a lighting jig.

BACKGROUND OF THE INVENTION

In the manufacturing procedure of a backlight module, a lighting jig is required to be used to perform a lighting test on the backlight module.

A lighting jig currently used comprises: a lighting jig body; a circuit board provided on the lighting jig body; a FPC clamping device provided on the lighting jig body and used to clamp the power input terminal of the backlight module (e.g. the input terminal of Flexible Printed Circuit (FPC) in the backlight module) onto the output terminal of the circuit board on the lighting jig body; and a constant current box whose input terminal is electrically connected to a power supply, whose output terminal is electrically connected to the input terminal of the circuit board on the lighting jig body, and on which a switch is provided.

Specifically, in the process of operation, first, a backlight module to be tested is placed and positioned on the lighting jig body, then the handle of the FPC clamping device is operated so as to press down the FPC clamping device such that the input terminal of the FPC in the backlight module and the output terminal of the circuit board on the lighting jig body are aligned and clamped, and then the switch on the constant current box is closed to connect the power supply and light up the backlight module to perform testing; after the test is finished, open the switch on the constant current box to cut off the electrical connection between the power supply and the circuit board on the lighting jig body, loosen the FPC clamping device, and take out the tested backlight module.

For the above mentioned lighting jig, it needs to open the switch on the constant current box every time after finishing testing a backlight module, and close the switch on the constant current box after pressing down the FPC clamping device when performing the next test, which is cumbersome in operation. Thus, in the process of performing a lighting test on a backlight module using the lighting jig, there is always a case that an operator forgets to open the switch on the constant current box after testing, when testing the next backlight module, the circuit board on the lighting jig body is operated with the power supply connected. When clamping the input terminal of the FPC in the backlight module and the output terminal of the circuit board on the lighting jig body, phenomenon such as point discharge, transient surge and the like occurs between the output terminal of the circuit board on the lighting jig body and the input terminal of the FPC in the backlight module. As a result, the FPC in the backlight module is burned out, damaged or the like, and product quality is thus affected.

SUMMARY OF THE INVENTION

The present invention provides a lighting jig for testing a backlight module, with which the possibility that a flexible printed circuit in the backlight module is burned out, damaged or the like can be reduced when testing the backlight module.

To achieve the above objective, the following technical solutions are provided.

A lighting jig for testing a backlight module, comprising a switch unit and a delay unit; wherein, the switch unit is connected to a power supply, and when the switch is in closed position, a power output terminal of the lighting jig is electrically connected to a power input terminal of the backlight module, a closing signal is generated at the same time, and the closing signal is output to the delay unit; and the delay unit is connected to the power supply, and outputs a delayed power signal to the power input terminal of the backlight module upon receipt of the closing signal output from the switch unit so as to delay the lighting up of the backlight module.

Preferably, the lighting jig further comprises: a constant current box whose power input terminal is electrically connected to the output terminal of the delay unit, and whose output terminal is electrically connected to the power input terminal of the backlight module so as to output a power signal being constant to the power input terminal of the backlight module.

Preferably, the lighting jig further comprises a lighting jig body; the switch unit comprises: a clamping device provided on the lighting jig body, the clamping device comprises an operating handle and clamps the power input terminal of the backlight module onto the power output terminal of the lighting jig to electrically connect the power output terminal of the lighting jig to the power input terminal of the backlight module when the operating handle of the clamping device is in closed position; and a sensor unit provided on the lighting jig body, the sensor unit generates the closing signal when the operating handle of the clamping device is in closed position.

Preferably, the sensor unit is implemented by a non-contact position sensor.

Preferably, the operating handle of the clamping device is made of metal material, and the sensor unit is implemented by a metal proximity switch whose power input terminal is connected to the power supply, and when the operating handle of the clamping device is in closed position, the metal proximity switch senses proximity of the operating handle, and generates the closing signal which is output to the delay unit from a signal output terminal of the metal proximity switch.

Preferably, the delay unit is implemented by an electromagnetic time delay relay whose power input terminal is connected to the power supply; the electromagnetic time delay relay comprises a control coil whose positive connector is electrically connected to the anode of the power supply, and whose negative connector is electrically connected to the signal output terminal of the metal proximity switch.

Preferably, the electromagnetic time delay relay has multiple sets of output terminals, each set of output terminals includes a positive output terminal and a negative output terminal, and output terminals in different sets implement different delays.

Preferably, the range of delay adjustment of the electromagnetic time delay relay is greater than 0 and less than or equal to 5 seconds.

Preferably, the power input terminal of the constant current box includes a positive input terminal which is electrically connected to one positive output terminal of the electromagnetic time delay relay and a negative input terminal which is electrically connected to the negative output terminal in the same set as said one positive output terminal.

Preferably, the power input terminal of the electromagnetic time delay relay and the power input terminal of the metal proximity switch are electrically connected to the power supply through quick connectors.

Preferably, the electrical connection between the output terminal of the constant current box and the power input terminal of the backlight module, the electrical connection between the power input terminal of the metal proximity switch and the power supply, and the electrical connection between the signal output terminal of the metal proximity switch and the negative connector of the control coil of the electromagnetic time delay relay are implemented through quick connectors.

When using the lighting jig according to the present invention to perform a lighting test on a backlight module, if the switch unit is in closed position, the power input terminal of the backlight module is electrically connected to the power output terminal of the lighting jig, and the switch unit generates a closing signal and outputs the closing signal to the delay unit. Upon receipt of the closing signal, the delay unit outputs the delayed power signal to the power input terminal of the backlight module through its output terminal so as to delay the lighting up of the backlight module. It can be seen that, after the power input terminal of the backlight module is electrically connected to the power output terminal of the lighting jig by the switch unit, the power signal does not supply power to the power input terminal of backlight module instantly, but after a period of delay. Therefore, the possibility that phenomenon such as point discharge, transient surge and the like occurs between the power output terminal of the lighting jig and the power input terminal of the backlight module is reduced, and accordingly the possibility that the power input terminal of the backlight module is burned out, damaged or the like can be reduced.

DETAILED DESCRIPTION OF THE PREFERRED EMBODIMENTS

Technical solutions in embodiments of the present invention will be described clearly and completely below with reference to the accompanying drawings. Obviously, the embodiments described herein are only part of embodiments of the present invention, but not all. Based on the described embodiments, other embodiments obtained by the person skilled in the art without creative efforts belong to the scope protected by the present invention.

Figure 1:
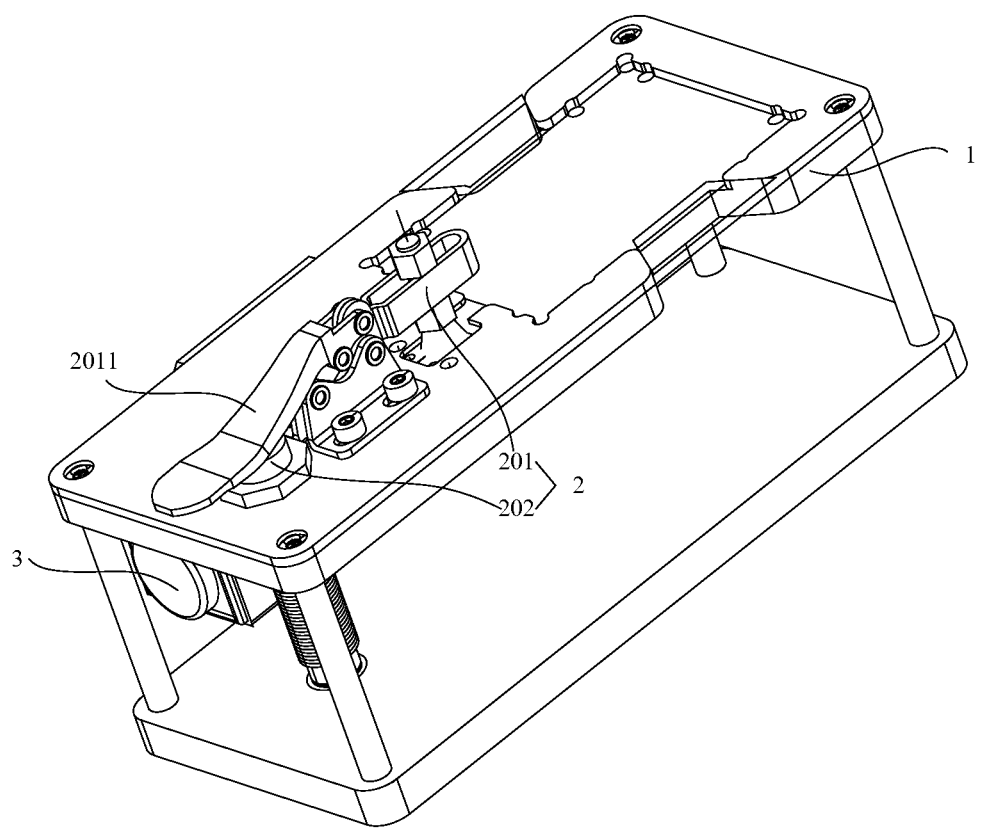
FIG. 1 is a schematic perspective view of a lighting jig according to an embodiment of the present invention.
Figure 2:
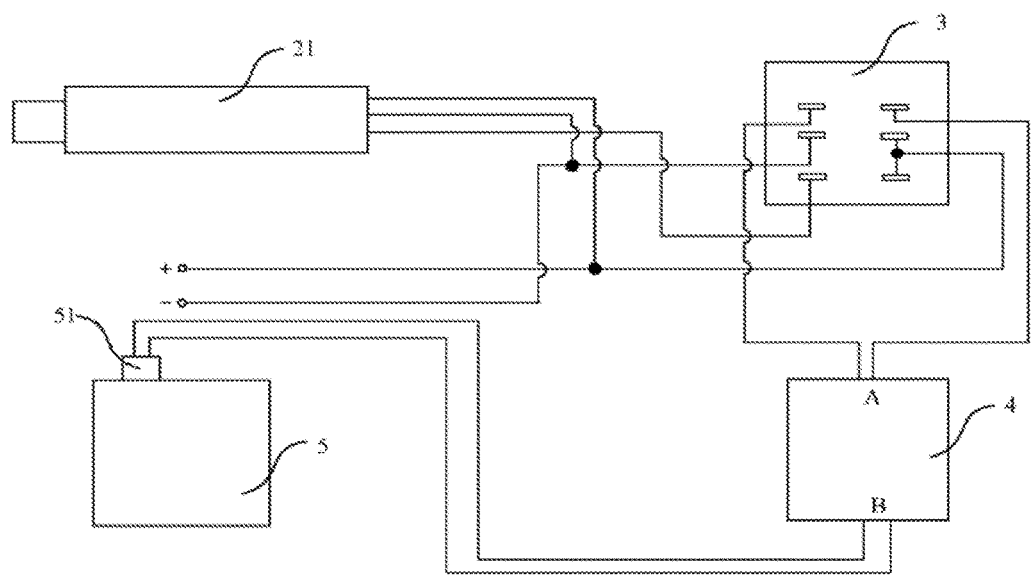
FIG. 2 is a schematic view illustrating the circuit principle of a lighting jig according to an embodiment of the present invention.

FIG. 1 is a schematic perspective view of a lighting jig according to an embodiment of the present invention. FIG. 2 is a schematic view illustrating the circuit principle of a lighting jig according to an embodiment of present invention.

As shown in FIGS. 1 and 2, a lighting jig provided according to an embodiment of the present invention comprises a switch unit 2 and a delay unit 3; wherein the switch unit 2 is connected to a power supply, and when the switch unit 2 is in closed position, a power output terminal of the lighting jig is electrically connected to a power input terminal of a backlight module 5, a closing signal is generated at the same time, and the closing signal is output to the delay unit 3; the delay unit 3 is connected to the power supply, and outputs a delayed power signal to the power input terminal 51 of the backlight module 5 upon receipt of the closing signal output from the switch unit 2 so as to delay lighting up of the backlight module 5.

When using the lighting jig according to the embodiment of the present invention to perform a lighting test on a backlight module 5, if the switch unit 2 is in closed position, the power input terminal 51 of the backlight module 5 is electrically connected to the power output terminal of the lighting jig, and the switch unit 2 generates a closing signal and outputs the closing signal to the delay unit 3. Upon receipt of the closing signal, the delay unit 3 outputs the delayed power signal to the power input terminal 51 of the backlight module 5 through its output terminal so as to delay lighting up of the backlight module 5. It can be seen that, after the power input terminal 51 of the backlight module 5 is electrically connected to the power output terminal of the lighting jig by the switch unit 2, the power signal doesn't supply power to the power input terminal 51 of backlight module 5 instantly, but after a period of delay. Therefore, the possibility that phenomenon such as point discharge, transient surge and the like occurs between the power output terminal of the lighting jig and the power input terminal 51 of the backlight module 5 is reduced, and accordingly the possibility that the power input terminal 51 of the backlight module 5 is burned out, damaged or the like can be reduced.

Preferably, in order to improve the constancy of current input to the backlight module 5, the lighting jig further comprises a constant current box 4. The power input terminal A of the constant current box 4 is electrically connected to the output terminal of the delay unit 3, the output terminal B of the constant current box 4 is electrically connected to the power input terminal 51 of the backlight module 5, and thus power signal being constant is output to the power input terminal 51 of backlight module 5 to light up the backlight module 5.

Specifically, as shown in FIG. 1, the lighting jig mentioned in the above technical solutions further comprises a lighting jig body 1, and the switch unit 2 comprises: a clamping device 201 provided on the lighting jig body 1, and the clamping device 201 comprises an operating handle 2011. When the operating handle 2011 is in closed position, the power input terminal 51 of the backlight module 5 is clamped onto the power output terminal of the lighting jig by the clamping device 201 such that the power output terminal of the lighting jig is electrically connected to the power input terminal 51 of the backlight module 5.

The switch unit 2 further includes a sensor unit 202 provided on the lighting jig body 1, and when the operating handle 2011 is in closed position, the sensor unit 202 generates the closing signal.

Specifically, the sensor unit 202 may be optional, for example, it may be a contact position sensor, or a non-contact position sensor; preferably, in order to extend the service life of the sensor unit 202, the sensor unit 202 uses a non-contact position sensor.

Preferably, the operating handle 2011 is made of metal material; the sensor unit 202 is implemented by a metal proximity switch 21.

Metal proximity switch is an automatic control electronic switch widely used in detection field, and it comprises a detection probe and an electronic switch. When a metal object approaches the detection probe, the electronic switch is turned on, and a closing signal is generated; when the metal object is away from the detection probe, the electronic switch is turned off and no closing signal is generated.

Figure 3:
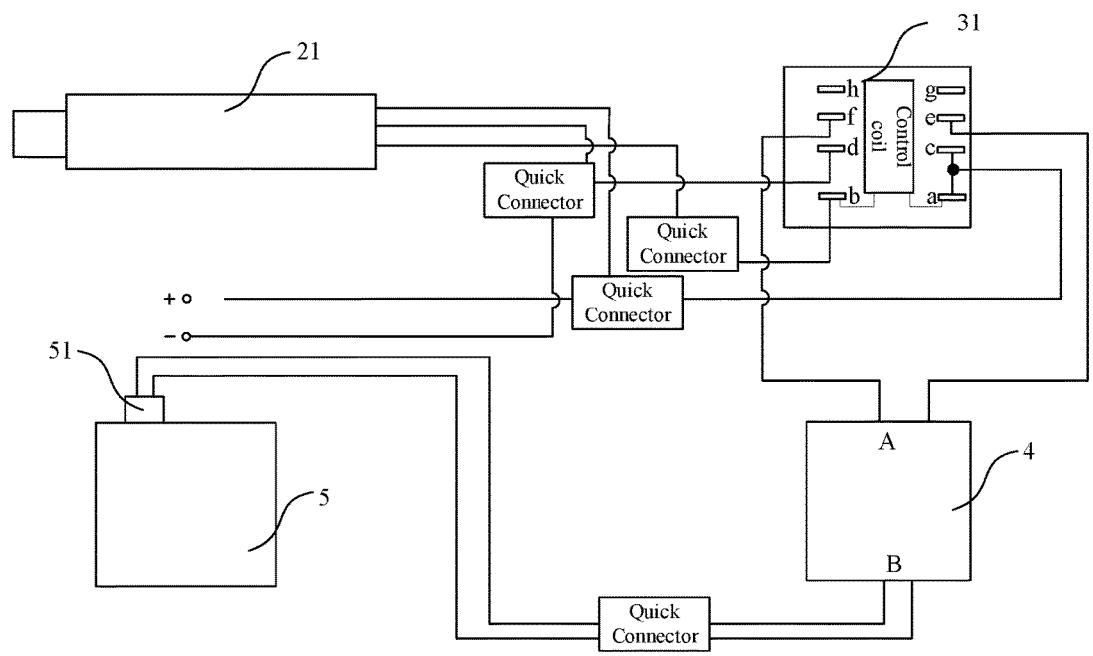
FIG. 3 is a schematic view illustrating the circuit principle when the delay unit in a lighting jig according to an embodiment of the present invention is implemented by an electromagnetic time delay relay.

As shown in FIG. 3, the power input terminal of the metal proximity switch 21 is connected to the power supply. When the operating handle 2011 is in closed position, the metal proximity switch 21 senses the proximity of the operating handle 2011 and generates a closing signal which is output through the signal output terminal of the metal proximity switch 21 to the delay unit 3.

Specifically, as shown in FIG. 3, the positive input terminal of the metal proximity switch 21 is electrically connected to the anode of the power supply, and the negative input terminal of the metal proximity switch 21 is electrically connected to the cathode of the power supply.

Similarly, the delay unit 3 can also be optional, and preferably is a time delay relay including pneumatic type and electromagnetic type. Preferably, the delay unit 3 is implemented by an electromagnetic time delay relay 31.

As shown in FIG. 3, the power input terminal of the electromagnetic time delay relay 31 is electrically connected to the power supply. Specifically, the power input terminal of the electromagnetic time delay relay 31 comprises a positive power input terminal c which is electrically connected to the anode of the power supply and a negative power input terminal d which is electrically connected to the cathode of the power supply; the electromagnetic time delay relay 31 comprises a control coil whose positive connector a is electrically connected to the anode of the power supply and whose negative connector b is electrically connected to the signal output terminal of the metal proximity switch 21.

In order to achieve various delay adjustment, preferably, the electromagnetic time delay relay 31 has multiple sets of output terminals, each set of output terminals includes a positive output terminal and a negative output terminal, and the output terminals in different sets implement different delays. As illustrated in FIG. 3, the output terminals of the electromagnetic time delay relay 31 include a positive output terminal e and a negative output terminal f, and a positive output terminal g and a negative output terminal h.

Specifically, the range of delay adjustment of the electromagnetic time delay relay 31 is greater than 0 and less than or equal to 5 seconds, e.g. 1 s, 2 s, 2.5 s, 3 s, 4 s, 5 s, etc.

Specifically, the power input A of the constant current box 4 includes a positive input terminal which is electrically connected to one positive output terminal of the electromagnetic relay delay 31 (e.g. the positive output terminal e shown in FIG. 3), and a negative input terminal which is electrically connected to the negative output terminal in the same set as said one positive output terminal (e.g. the negative output terminal f shown in FIG. 3).

On the basis of the above technical solutions, in order to facilitate connection, the power input terminal of the electromagnetic time delay relay 31 and the power input terminal of the metal proximity switch 21 are electrically connected to the power supply through quick connectors. Specifically, as shown in FIG. 3, the positive power input terminal c of the electromagnetic time delay relay 31 and the positive power input terminal of the metal proximity switch 21 are electrically connected to the anode of the power supply, the negative power input terminal d of the electromagnetic time delay relay 31 and the negative power input terminal of the metal proximity switch 21 are electrically connected to the cathode of the power supply.

Of course, a set of constant current box 4 and electromagnetic time delay relay 31 can be used to satisfy the operation requirements of various lighting jigs of different specifications to improve the utility of the constant current box 4 and the electromagnetic time delay relay 31. Preferably, the electrical connection between the output terminal B of the constant current box 4 and the power input terminal 51 of the backlight module 5, the electrical connection between the power input terminal of the metal proximity switch 21 and the power supply, and the electrical connection between the signal output terminal of the metal proximity switch 21 and the negative connector b of the control coil of the electromagnetic time delay relay 31 are implemented through quick connectors.

In the above technical solutions, the electromagnetic time delay relay 31 may be fixed to the lighting jig body 1, and the metal proximity switch 21 can also be fixed to the lighting jig body 1.

It is obvious to the person skilled in the art that various modifications and variations can be made to the embodiments of the present invention without departing from the scope and spirit of the present invention. Thus, if the modifications and variations of the present invention are within the scope of the appended claims and equivalents thereof, these modifications and variations are intended to be included in the present invention.

The invention claimed is:

1. A lighting jig for testing a backlight module, comprising a switch unit and a delay unit; wherein
   the switch unit is connected to a power supply, and when the switch unit is in closed position, a power output terminal of the lighting jig is electrically connected to a power input terminal of the backlight module via the delay unit, a closing signal is generated at the same time, and the closing signal is output to the delay unit; and
   the delay unit is connected to the power supply, and outputs a delayed power signal to the power input terminal of the backlight module upon receipt of the closing signal output from the switch unit so as to delay a supply of power to the backlight module.

2. The lighting jig according to claim 1, further comprising:
   a constant current box whose power input terminal is electrically connected to an output terminal of the delay unit, and whose output terminal is electrically connected to the power input terminal of the backlight module so as to output a power signal being constant to the power input terminal of the backlight module.

3. The lighting jig according to claim 1, further comprising a lighting jig body; and the switch unit comprising:
   a clamping device provided on the lighting jig body, the clamping device comprising an operating handle, and clamping the power input terminal of the backlight module onto the power output terminal of the lighting jig to electrically connect the power output terminal of the lighting jig to the power input terminal of the backlight module when the operating handle of the clamping device is in closed position; and
   a sensor unit provided on the lighting jig body, the sensor unit generating the closing signal when the operating handle of the clamping device is in closed position.

4. The lighting jig according to claim 2, further comprising a lighting jig body; and the switch unit comprising:
   a clamping device provided on the lighting jig body, the clamping device comprising an operating handle, and clamping the power input terminal of the backlight module onto the power output terminal of the lighting jig to electrically connect the power output terminal of the lighting jig to the power input terminal of the backlight module when the operating handle of the clamping device is in closed position; and a sensor unit provided on the lighting jig body, the sensor unit generating the closing signal when the operating handle of the clamping device is in closed position.

5. The lighting jig according to claim 3, wherein the sensor unit is implemented by a non-contact position sensor.

6. The lighting jig according to claim 4, wherein the sensor unit is implemented by a non-contact position sensor.

7. The lighting jig according to claim 3, wherein
the operating handle of the clamping device is made of metal material, and the sensor unit is implemented by a metal proximity switch whose power input terminal is connected to the power supply, and when the operating handle of the clamping device is in closed position, the metal proximity switch senses proximity of the operating handle, and generates the closing signal which is output to the delay unit through a signal output terminal of the metal proximity switch.

8. The lighting jig according to claim 4, wherein
the operating handle of the clamping device is made of metal material, and the sensor unit is implemented by a metal proximity switch whose power input terminal is connected to the power supply, and when the operating handle of the clamping device is in closed position, the metal proximity switch senses proximity of the operating handle, and generates the closing signal which is output to the delay unit through a signal output terminal of the metal proximity switch.

9. The lighting jig according to claim 7, wherein the delay unit is implemented by an electromagnetic time delay relay whose power output terminal is connected to the power supply; the electromagnetic time delay relay comprises a control coil whose positive connector is electrically connected to the anode of the power supply, and whose negative connector is electrically connected to the signal output terminal of the metal proximity switch.

10. The lighting jig according to claim 8, wherein the delay unit is implemented by an electromagnetic time delay relay whose power output terminal is connected to the power supply; the electromagnetic time delay relay comprises a control coil whose positive connector is electrically connected to the anode of the power supply, and whose negative connector is electrically connected to the signal output terminal of the metal proximity switch.

11. The lighting jig according to claim 9, wherein the electromagnetic time delay relay has multiple sets of output terminals, each set of output thermals includes a positive output terminal and a negative output terminal, and output terminals in different sets implement different delays.

12. The lighting jig according to claim 10, wherein the electromagnetic time delay relay has multiple sets of output terminals, each set of output thermals includes a positive output terminal and a negative output terminal, and output terminals in different sets implement different delays.

13. The lighting jig according to claim 11, wherein the range of delay adjustment of the electromagnetic time delay relay is greater than 0 and less than or equal to 5 seconds.

14. The lighting jig according to claim 12, wherein the range of delay adjustment of the electromagnetic time delay relay is greater than 0 and less than or equal to 5 seconds.

15. The lighting jig according to claim 11, wherein the power input terminal of the constant current box includes a positive input terminal which is electrically connected to one positive output terminal of the electromagnetic time relay delay and a negative input terminal which is electrically connected to the negative output terminal in the same set as said one positive output terminal.

16. The lighting jig according to claim 12, wherein the power input terminal of the constant current box includes a positive input terminal which is electrically connected to one positive output terminal of the electromagnetic time relay delay and a negative input terminal which is electrically connected to the negative output terminal in the same set as said one positive output terminal.

17. The lighting jig according to claim 9, wherein the power input terminal of the electromagnetic time delay relay and the power input terminal of the metal proximity switch are electrically connected to the power supply through quick connectors.

18. The lighting jig according to claim 10, wherein the power input terminal of the electromagnetic time delay relay and the power input terminal of the metal proximity switch are electrically connected to the power supply through quick connectors.

19. The lighting jig according to claim 9, wherein the electrical connection between the output terminal of the constant current box and the power input terminal of the backlight module, the electrical connection between the power input terminal of the metal proximity switch and the power supply, and the electrical connection between the signal output terminal of the metal proximity switch and the negative connector of the control coil of the electromagnetic time delay relay are implemented through quick connectors.

20. The lighting jig according to claim 10, wherein the electrical connection between the output terminal of the constant current box and the power input terminal of the backlight module, the electrical connection between the power input terminal of the metal proximity switch and the power supply, and the electrical connection between the signal output terminal of the metal proximity switch and the negative connector of the control coil of the electromagnetic time delay relay are implemented through quick connectors.

21. The lighting jig according to claim 1, wherein a period of the delay of the supply of power to the backlight module is set to reduce a point discharge or transient surge between the lighting jig and the backlight module.

* * * * *